April 29, 1969 P. W. WAGENER ET AL 3,441,872
SELF-STARTING OSCILLATOR WITH PLURAL MONOSTABLE MULTIVIBRATORS
Filed Sept. 18, 1967
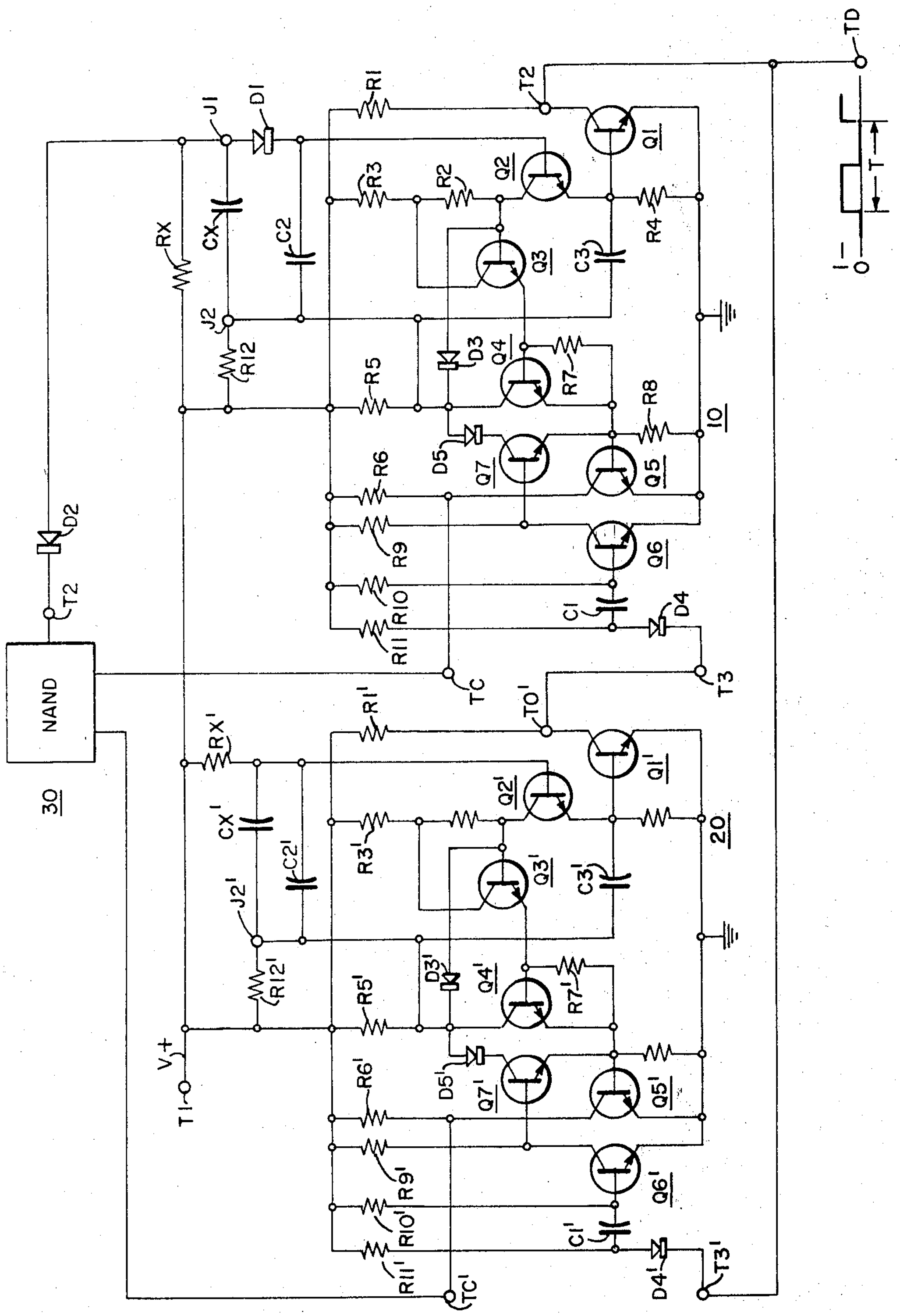

United States Patent Office 3,441,872

Patented Apr. 29, 1969

3,441,872

SELF-STARTING OSCILLATOR WITH PLURAL MONOSTABLE MULTIVIBRATORS

Paul W. Wagener and Francis H. Downhower, Jr., Lancaster, N.Y., assignors to Westinghouse Electric Corporation, Pittsburgh, Pa., a corporation of Pennsylvania Filed Sept. 18, 1967, Ser. No. 668,502

Int. Cl. H03b *5/06*

U.S. Cl. 331—52 8 Claims

ABSTRACT OF THE DISCLOSURE

The subject matter of the present disclosure relates to a self-starting oscillator wherein a pair of one shot monostable multivibrators have their outputs respectively coupled to provide an input to the other of the multivibrators. A complementary output is supplied by each of the multivibrators as an input to a logic element which supplies a logic output whenever both of the complementary outputs are of the same output state. The logic output is coupled to one of the multivibrators to change its output state and thereby initiate oscillation to the oscillator.

BACKGROUND OF THE INVENTION

The present invention relates to oscillator circuitry and more particularly to oscillator circuitry which is self-oscillatory upon start-up.

By cross coupling the outputs to the inputs respectively of a pair of monostable multivibrators, a stable multivibrator having a selectable oscillatory frequency may be provided. The change in output states of one of the monostable multivibrators instigates the change of state of the other of the multivibrators whose output is in turn coupled back to the first multivibrator to change its output state. Thus, the oscillatory cycle is continued with such an oscillator acting as, for example, a clock pulse source wherein the pulse duration and period of oscillation may be determined by the adjustment of the monostable multivibrators. In order to sustain oscillation, it is necessary that the monostable multivibrators have opposite output states at a given time. However, at start-up, when operating potential is initially applied to the monostable multivibrators, the circuits will typically assume the same output states. Therefore, it is necessary that some means be provided for changing the output state of one of the monostable multivibrators so as to instigate oscillation. This is commonly done through the use of a manual pushbutton switch for effecting the change of output states of one of the monostable multivibrators. It can thus be seen that it would be highly desirable to effect the instigation of oscillation of the oscillator immediately at start-up without the necessity of any manual or external inputs to the oscillator.

SUMMARY OF THE INVENTION

Broadly, the present invention provides a self-starting oscillator wherein a pair of monostable multivibrators are provided with each supplying an output and a complementary output. The output of each of the multivibrators is utilized as an input to the other of the multivibrators, while the complementary outputs are supplied to a logic circuit which in response thereto supplies a logic output whenever the outputs of the monostable multivibrators are at the same output state. The logic output is then coupled to one of the multivibrators to change its output state to be different from the other of the multivibrators and thereby instigate oscillation.

BRIEF DESCRIPTION OF THE DRAWING

The single figure is a schematic-block diagram of the self-starting oscillator of the present invention.

DESCRIPTION OF THE PREFERRED EMBODIMENT

Referring to the figure, a self-starting oscillator is shown including three major elements: a first one-shot multivibrator 10, a second one-shot multivibrator 20 and a NAND logic circuit 30. The monostable multivibrators 10 and 20 are substantially identical except for the inclusion of a diode D1 in the multivibrator 10. Due to this similarity, similar circuit components in the multivibrator 20 will be indicated with a prime. In explaining the operation of the oscillator of the figure, a "one" and "zero" logic system will be utilized with a logical "one" indicating a positive voltage, and a logical "zero" indicating a zero or ground potential. It should be understood, of course, that other logical binary values could be utilized within the scope of the present invention.

In order to instigate operation of the oscillator, a source of operating potential V+ is connected to a terminal T1 so that an operating potential apears at a line V+ which is positive with respect to ground and of a sufficient positive value for the operation of transistor circuitry. The application of the V+ potential to the multivibrators 10 and 20 causes each of these multivibrators to asume its normal start-up state. Thus, in the monostable multivibrator 10, a transistor Q1 is turned on having its collector connected via a resistor R1 to the V+ line, the emitter thereof being grounded. Also a transistor Q2 is turned on having its collector connected via a pair of resistors R2 and R3 to the V+ line, and its emitter electrode connected to the base of the transistor Q1 and via a resistor R4 to ground. A transistor Q3 which has its base connected to the collector of the transistor Q2, however, appears in its turned off state with the collector thereof being connected to the junction between the resistors R2 and R3. The emitter of the transisor Q3 is connected to the base of the transistor Q4 which has its emitter electrode connected to the base electrode of a transistor Q5. The collectors of the transistor Q4 and R5 are, respectively, connected via resistors R5 and R6 to the V+ line, and the emitter base electrodes thereof are connected respectively by a resistor R7 and a resistor R8, with the emitter of the transistor Q5 being grounded. The transistors Q4 and Q5 being coupled to the transistor Q3 also appear in the turned off state.

Also at start-up with the application of the V+ potential, a transistor Q6 is turned on having its collector electrode connected through a resistor R9 to the V+ line, and its base electrode connected through a resistor R10 to the V+ line, the emitter thereof being grounded. A transistor Q7 is normally off with the transistor Q6 being turned on having its base connected to the collector of the transistor Q6. The emitter of the transistor Q7 is connected to the base-emitter connection of the transistors Q5–Q4.

The output from the oscillator is taken from a terminal T0 which is connected to the collector of the transistor Q1. A complementary output as compared to the output terminal T0 is taken from a terminal TC which is connected to the collector of the transistor Q5. To summarize the conductive state of each of the transistors: transistors Q1, Q2 and Q6 are in the on state, while transistors Q3, Q4, Q5 and Q7 are in the off state, whenever the V+ potential is initially applied thereto. Analogously in the monstable multivibrator 20 when the V+ potential is applied: transistors Q1′, Q2′ and Q6′ assume the on state and transistors Q3′, Q4′, Q5′ and Q7′ assume the off state. The output of the monostable multivibrator 20 is taken at a terminal T0′ at the collector of the transistor Q1′, and the complementary output is taken from a terminal TC′ at the collector of the transistor Q5′.

Hence, at the start-up the logical output of the multivibrator 10 at the terminal T0 is a "zero" since the transistor Q1 is turned on, and similarly at the monostable multivibrator 20 the logical output at the terminal T0′ is a "zero" with the transistor Q1′ being on. The complementary outputs at the terminals TC and TC′ of the multivibrators 10 and 20, respectively, are thus at a "one" logical state and are applied as inputs to the NAND 30.

The NAND 30 performs the logical function that whenever inputs of the "one" logical state are applied thereto a "zero" state is provided at its output terminal T2. Thus, with "one" inputs being supplied from the complementary terminals TC and TC′, a "zero" output state will appear at the terminal T2. A diode D2 is connected with its cathode to the terminal T2 and its anode to a junction J1 at the anode of the diode D1 of the multivibrator 10. The cathode of the diode D1 is connected to the base of the transistor Q2. The transistor Q2 turns off in response to the appearance of the "zero" or ground signal at the terminal T2, its base being coupled via the diode D1 and D2 to the terminal T2 of the NAND 30. The turning off of the transistor Q2 also causes the turning off of the transistor Q1 with the collector thereof going positive to provide a logical "one" output as shown in the diagram adjacent the terminal T0 at the collector of the transistor Q1.

The transistor Q3 is turned on in response to the turning off of the transistor Q2 with the base of the transistor Q3 being coupled to the collector of the transistor Q2. In response to the conduction of the transistor Q3, the transistors Q4 and Q5 are turned on. The transistors Q6 and Q7, however, remain in their previous states, with the transistor Q6 remaining on and the transistor Q7 remaining off. A diode D3 is coupled between the base of the transistor Q3 and the V+ source to block V+ potential from being applied thereto except when the transistor Q2 is turned off. The output of multivibrator 10 at terminal T0 is applied as an input via a terminal T3′ to multivibrator 20. Similarly, the output from terminal T0′ of multivibrator 20 is applied to the input terminal T3 of multivibrator 10.

The turning off of the transistor Q2 and the transistor Q1, causes a logical "one" output to appear at output terminal T0, while the complementary output of the multivibrator 10 taken at the terminal TC at the collector of the transistor Q5 goes to a "zero" since the transistor Q5 is turned on. Thus, the NAND circuit 30 receiving a "zero" from multivibrator 10 and a "one" from multivibrator 20 still provides a "one" does not provide a "zero" output, and the transistor Q2 therefore is again supplied with the operating voltage V+ to turn on the transistor Q2, and thus the transistor Q1. The transistor Q1 having a "zero" output at the terminal TZ thereby essentially grounds the terminal T3′ at the input of the multivibrator 20. The base of the transistor Q6′ coupled via a capacitor C1 and a diode D4′ to terminal T3 is thus pulled down thereby turning off this transistor. The anode of the diode D4′ is connected via a resistor C11′ to the V+ line. In response to the turning off of the transistor Q6′, the transistor Q7′ is turned on. The turning on of the transistor Q7′ with the collector thereof being connected via a diode D4′ to a junction J2′ at one common end of a capacitor CX′, C2′ and C3′. The other ends of the capacitor CX′ and C2′ are connected to the base of the transistor Q2′ and hence pull down the base of transistor Q2 thereby turning it off. The other end of capacitor Q3′ is connected to the base of transistor Q1′ with transistor Q1′ turning off in response to the turning on of transistor Q7 and the turning on of transistor Q2. At this time the timing cycle for the multivibrator 20 begins with the capacitors CX′ and C2′ recharging through a resistor RX′ which is connected between the V+ source and the capacitor junction at the base of the transistor Q2′. The transistor Q2′ will remain turned off until the voltage builds up across the capacitors CX′ and C2′ to a sufficient magnitude to turn on the transistor Q2′. The unstable period of the multivibrator will be determined by the magnitude of the resistor RX′ and the capacitor CX′ and C2′. When the voltage at the base of transistor Q2′ reaches sufficient magnitude Q2′ will be turned on with the transistor Q1′ also turning on to provide a zero output at the terminal T0′. In response to the turning on of the transistor Q2′, the transistors Q3′, Q4′ and Q5′ will be turned off.

The "zero" or ground signal appearing at the terminal T0′ will thereby apply a "zero" signal through the terminal T3, the diode D4, the capacitor C1 to essentially ground the base of the transistor Q6 thereby turning off this transistor. The transistor Q7 will thus be turned on, which will pull down the base of the transistor Q2 via the capacitors CX and C2′ and the base of the transistor Q1 via the capacitor C3′. This will begin the timing cycle for the monostable multivibrator 10 with the capacitors CX and C2′ recharging through the resistor RX. When the charge on the capacitors CX and C2 reach a sufficient value as determined by the components RX, CX and C2, the transistor Q2 will be turned on with the transistor Q1 also being turned on to supply a zero logical output at the terminal T0 connected to the collector thereof.

With a "zero" output being supplied by the transistor Q1 to the input terminal T3′ of multivibrator 20, the transistor Q6′ of the multivibrator 20 would be turned off again to restart the timing cycle for the monostable multivibrator 20 as previously described.

The transistors Q6–Q7 and Q6′–Q7′ form a separate monostable pair and revert to their normal states with the transistors Q6 and Q6′ being normally conductive and the transistors Q7 and Q7′ being normally nonconductive, according to the time constant provided by the resistor R10, capacitor C1 and the resistor R10′, capacitor C1′, respectively. This time constant is so selected that the transistor pairs Q6–Q7 and Q6′–Q7′ will be in their normally conductive states whenever the output changes from the other multivibrator.

Once oscillations have been instigated in the oscillator, a "one" signal appears at the terminal T2 at the output of the NAND 30 since different output states are supplied to the inputs of the NAND 30 from the multivibrator complementary outputs TC and TC′. The "one" output at the terminal T2 reverse biases the diode D2 and thereby isolates the NAND circuit 30 from the frequency determining elements RX, CX and C2 of the multivibrator 10. Thus, the NAND circuit 30 will only be operative during the start-up period when it is desired to assure that the multivibrators 10 and 20 assume different output states so that oscillation may be instigated. The diode D1 between the anode of the diode D2 and the base of transistor Q2 provides a voltage drop to force current through the diode D2 during the self-start period of the oscillator. A resistor R4 is connected between the V+ line and the junction J2 to reduce power losses in the resistor RX.

It can thus be seen that as soon as the operating voltage V+ is applied to the multivibrators 10 and 20, even though both multivibrators assume normal "zero" output states at terminals T0 and T0′, with the complementary outputs both at a "one" logical state and being applied to the NAND 30, a "zero" output at the terminal T2 is applied to multivibrator 10 to change its output state to a "one." The multivibrator 20 then reverts to a "zero" output state which is applied to the multivibrator 20 thereby changing its output state, which in turn is applied to the multivibrator 10 thereby instigating oscillations. Once oscillation has commenced, the NAND circuit 30 is isolated from the frequency determining elements of the oscillator by the back-biasing of the diode D2.

Although the present invention has been described with a certain degree of particularity, it should be understood that the present disclosure has been made only by way of example, and that numerous changes in the details of circuitry and the combination and arrangement of parts, elements and components can be resorted to without departing from the spirit and scope of the present invention.

We claim as our invention:

1. A self-starting oscillator circuit comprising:

first and second monostable multivibrator circuits each providing an output and a complementary output in response to an input thereto;

said multivibrator circuits being coupled so that said outputs of said first and second multivibrator circuits respectively providing inputs for said second and first multivibrator circuits; and a logic circuit responsive to said complementary outputs to provide a logic signal output to one of said multivibrator circuits to establish said multivibrator circuits at different output states so as to initiate oscillation of said oscillator circuit.

2. The circuit of claim 1 wherein:

said first and second monostable multivibrator circuits comprise one-shot multivibrator circuits.

3. The circuit of claim 2 wherein:

said multivibrators normally assuming the same output state at start-up upon the application of operating potential thereto, with one of said multivibrators changing output states in response to said logic signal output from said logic circuit.

4. The circuit of claim 3 including:

frequency determining elements operatively associated with each of said multivibrator circuits for determining the oscillatory frequency of said oscillator circuit.

5. The circuit of claim 4 wherein:

said logic circuit responsive to said complementary outputs from said first and second multivibrator circuits of the same output state to provide said logic signal output therefrom.

6. The circuit of claim 5 wherein:

said logic circuit including two inputs for receiving said complementary outputs of said first and second multivibrators, respectively, and responsive to provide said logic signal output when said complementary outputs are of the same output state; and coupling means for coupling said logic signal output to one of said multivibrator circuits.

7. The circuit of claim 6 wherein:

said coupling means including a first unidirectional device for translating said logic signal output to one of said multivibrator circuits to change its output state and thereby instigate oscillation.

8. The circuit of claim 7 including:

a second unidirectional device for isolating said frequency determining elements from said logic circuit during oscillation of said oscillator circuit.

References Cited

UNITED STATES PATENTS 2,735,939 2/1956 Forsberg ------------ 331—57

JOHN KOMINSKI, *Primary Examiner.*

U.S. Cl. X.R.

307—273; 328—207; 331—45, 57, 113